United States Patent [19]

Okamura

[11] Patent Number: 4,795,717

[45] Date of Patent: Jan. 3, 1989

[54] METHOD FOR PRODUCING SEMICONDUCTOR DEVICE

[75] Inventor: Shigeru Okamura, Ebina, Japan

[73] Assignee: Fujitsu Limited, Kawasaki, Japan

[21] Appl. No.: 94,079

[22] Filed: Sep. 8, 1987

Related U.S. Application Data

[62] Division of Ser. No. 618,668, Jun. 8, 1984, abandoned.

[30] Foreign Application Priority Data

Jun. 9, 1983 [JP] Japan .................. 58-101767

[51] Int. Cl.$^4$ .................. H01L 21/265; H01L 21/44; H01L 21/48
[52] U.S. Cl. .................. 437/40; 437/176; 437/184; 437/188; 437/912; 357/15; 357/51; 357/22
[58] Field of Search .................. 437/176, 184, 188, 40, 437/912; 357/22 I, 22 MD, 23.1, 15, 16, 91, 51; 148/DIG. 65

[56] References Cited

U.S. PATENT DOCUMENTS

| | | | |
|---|---|---|---|
| 4,194,935 | 3/1980 | Dingle et al. | 357/22 X |
| 4,310,570 | 1/1982 | Calviello | 357/22 X |
| 4,338,616 | 7/1982 | Bol | 357/15 |
| 4,377,030 | 3/1983 | Pettenpaul et al. | 357/15 X |
| 4,396,437 | 8/1983 | Kwok et al. | 357/15 X |
| 4,424,525 | 1/1984 | Mimura | 357/22 X |
| 4,434,013 | 2/1984 | Bol | 357/15 X |
| 4,467,519 | 8/1984 | Glang et al. | 357/91 X |
| 4,663,643 | 5/1987 | Mimura | 357/16 |

FOREIGN PATENT DOCUMENTS

| | | |
|---|---|---|
| 0056904 | 8/1982 | European Pat. Off. . |
| 0064370 | 11/1982 | European Pat. Off. . |
| 0080714 | 6/1983 | European Pat. Off. . |
| 0131379 | 1/1985 | European Pat. Off. . |
| 0180186 | 11/1981 | Japan .................. 357/22 |
| 577165 | 1/1982 | Japan . |
| 0042170 | 3/1982 | Japan .................. 357/22 |
| 0112080 | 7/1982 | Japan . |
| 0176773 | 10/1982 | Japan .................. 357/22 |

OTHER PUBLICATIONS

Lehovec et al, "Analysis of GaAs FET's for Integrated Logic," *IEEE Transactions on Electron Devices*, vol. ED-27, No. 6, Jun. 1980, pp. 1085-1086.

Chang, "Self-Aligned MESFET Structure", IBM Technical Disclosure Bulletin, vol. 24, No. 8, Jan. 1982, pp. 4071-4072.

Abe et al., "Advanced Device Technology for High Speed GaAs VLSI", Solid State Devices 1982, ESS-DERC-SSSDT Meeting at Munich, 13th-16th Sept. 1982, pp. 25-50.

Sze, VLSI Technology, Bell Telephone Laboratories, Inc., 1983, pp. 391-397.

Ghandhi, VLSI Fabricaiton Principles, John Wiley and Sons, Inc., 1983, pp. 330-337.

*Primary Examiner*—Brian E. Hearn
*Assistant Examiner*—M. Wilczewski
*Attorney, Agent, or Firm*—Staas & Halsey

[57] ABSTRACT

A semiconductor device with a FET utilizing a two-dimensional electron gas (2DEG), including a substrate, a first semiconductor layer (an undoped GaAs layer) formed on the substrate by an MBE method, a second semiconductor layer (an n-type AlGaAs layer) formed on the first layer by an MBE method, a source electrode and a drain electrode formed on the second layer and having alloyed regions, and a gate electrode formed on the second layer. To decrease the contact resistance between the alloyed regions and the 2DEG layer in the first layer, impurity doped regions are formed in the first layer under the source electrode and the drain electrode by an ion-implantation method, prior to the formation of the second layer. Further, an internal conductive line or resistor can be formed by doping impurities into the first layer by an ion-implantation method prior to the formation of the second layer.

30 Claims, 4 Drawing Sheets

METHOD FOR PRODUCING SEMICONDUCTOR DEVICE

This is a divisional of co-pending application Ser. No. 618,668, filed on June 8, 1984, now abandoned.

BACKGROUND OF THE INVENTION

The present invention relates to a semiconductor device, and more particularly to an improved field effect transistor (FET) which comprises a compound semiconductor having a heterojunction and can operate at a high speed by using a two-dimensional electron gas (2DEG), and a method of producing the device.

A FET having a heterojunction and utilizing a 2DEG is disclosed in, for example, Japanese Unexamined Patent Publication (Kokai) Nos. 57-7165, 57-176773, and 57-180186 and European patent application No. 82302107.6, i.e., EP-A No. 0064370. A main characteristic of the FET is high electron mobility due to accumulation of a 2DEG at the heterojunction interface and decrease of the ionized-impurity scattering effect. As the temperature of the FET is reduced, the lattice scattering effect is reduced and the mobility is further increased.

With a FET of the gallium-arsenide (GaAs) type, however, there is a problem that the parasitic source resistance Rs and the parasitic drain resistance Rd are relatively large, since, mainly, an aluminum-gallium-arsenide (AlGaAs) layer having a relatively high resistivity exists between a GaAs layer and the source and drain electrodes.

To improve the properties of the FET, it is necessary to decrease the source resistance Rs and drain resistance Rd. Accordingly, the source electrode and drain electrode are made of gold-germanium (AuGe) and are heated so that the AlGaAs layer and GaAs layer alloy with the AuGe. Thus, ohmic contact regions including a source region and a drain region and having a relatively low resistivity are formed under the electrodes. The contact resistance between the alloyed regions and the 2DEG layer is still, however, relatively large.

SUMMARY OF THE INVENTION

An object of the present invention is to reduce the contact resistance between the alloyed regions and the 2DEG layer, so that the parasitic source and drain resistance are further reduced.

Another object of the present invention is to increase the operation speed of an FET and to lower the noise of the FET due to the reduction of the parasitic resistances.

A further object of the present invention is to form a conductive line and/or a resistor at the heterojunction interface.

The above and other objects of the present invention are attained by forming impurity doped regions located under a source electrode and a drain electrode and corresponding to a conductive line and resistor, in a first semiconductor layer on which a second semiconductor layer is formed, the second layer being an electron-supply layer.

Accordingly, according to the present invention, there is provided a semiconductor device of a FET having a heterojunction and utilizing a two-dimensional electron gas, the device comprising: a substrate; a first semiconductor layer formed on the substrate; a second semiconductor layer, which is an electron-supply layer and has a smaller electron affinity than that of the first semiconductor layer, formed on the first semiconductor layer; a source electrode and a drain electrode formed on the second semiconductor layer and having alloyed regions extending into the first semiconductor layer; and a gate electrode formed on the second semiconductor layer. Impurity doped regions are formed in the first semiconductor layer under the source and drain electrodes, and, thus, the alloyed regions extend into the impurity doped regions. Therefore, the alloyed regions are connected with the 2DEG layer through the low resistivity impurity doped regions, whereby the contact resistance can be reduced.

BRIEF DESCRIPTION OF THE DRAWINGS

The present invention and its objects and features will become more apparent in the course of the detailed description set forth below, rendered with reference to the accompanying drawings, in which:

FIG. 2b is a circuit corresponding to the semiconductor device shown in FIG. 2a;

FIG. 3b is a circuit corresponding to the semiconductor device shown in FIG. 3a;

FIG. 4b is a schematic plan view of a semiconductor device corresponding to the circuit of FIG. 4a.

DESCRIPTION OF THE PREFERRED EMBODIMENTS

Referring to FIGS. 1a to 1e, an explanation will be made of a process for producing a semiconductor device with a FET utilizing the 2DEG in accordance with an embodiment of the present invention.

Figure 1A:
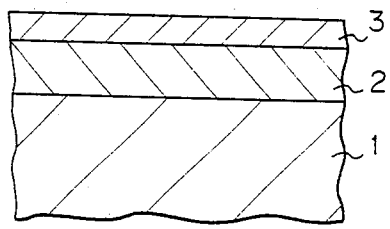
FIGS. 1a to 1e are schematic sectional views of a semiconductor device including a FET utilizing the 2DEG in various stages of production in accordance with an embodiment of the present invention.

As illustrated in FIG. 1a, on a semi-insulating GaAs substrate 1, an undoped GaAs layer (i.e., a first semiconductor layer) 2 is formed by a molecular beam epitaxy (MBE) method. The GaAs layer 2 has a thickness of from 400 to 1000 nm, e.g., approximately 600 nm. A masking film 3 of silicon dioxide ($SiO_2$), silicon nitride ($Si_3N_4$), aluminum nitride (AlN), or the like is formed on the GaAs layer 2 by a chemical vapor deposition (CVD) method, a sputtering method, or a reactive sputtering method.

Figure 1B:
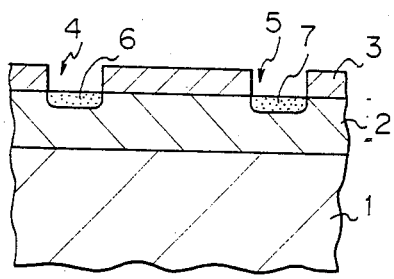

As illustrated in FIG. 1b, the masking film 3 is selectively etched to open two windows 4 and 5 therein by means of a conventional lithography technique, such as a photoetching method. Through the windows 4 and 5, impurities such as silicon (Si) or (selenium) are doped into the GaAs layer 2 by an ion-implantation method to form two impurity doped regions 6 and 7. For example, Si impurities of $5 \times 10^{13}$ cm$^{-3}$ are doped at an ion energy of 150 keV. Then, the masking film 3 is removed by a suitable etchant.

Figure 1C:
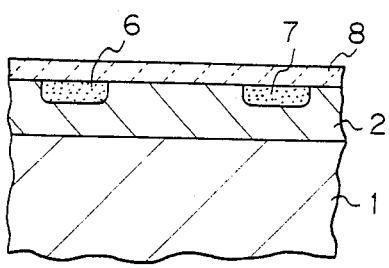

Annealing (heat-treatment) is necessary for recovering the damaged crystal of the doped regions. Since arsenic (As) tends to evaporate at a high temperature, as illustrated in FIG. 1c, a protective film 8 of $SiO_2$, $Si_3N_4$, or AlN is formed on the GaAs layer 2 by a CVD method, a sputtering method, or a reactive sputtering method prior to the annealing. For example, a protective film 8 of AlN having a thickness of approximately 0.1 $\mu$m is formed by the reactive sputtering method.

The annealing is carried out by means of a heating furnace, e.g., at a temperature of 850° C. for approximately 20 minutes or by a lamp annealing method using, e.g., a tungsten halogen lamp for an irradiation time of from 10 to 30 seconds. Lamp irradiation can heat the GaAs layer 2 to a temperature of from 950° C. to 1000° C. After the annealing, the protective film 8 is removed by a suitable etchant.

It is possible to carry out the annealing without the formation of the protective film 8 by using a decomposition of arsine $AsH_3$ contained in an atmosphere surrounding the semiconductor device to be annealed. Namely, during the annealing, a mixture gas of hydrogen ($H_2$), nitrogen ($N_2$), and $AsH_3$ is supplied into the heating furnace, wherein As decomposed from the $AsH_3$ at 600° C. or more prevents As of the GaAs layer 2 from evaporating. In the case of lamp annealing, the mixture gas should be heated at 600° C. or more near the semiconductor device by using a suitable heating means.

It is also possible to carry out the annealing without the formation of the protective film 8 by using an MBE apparatus, in which an As molecular beam strikes the GaAs layer 2 during the annealing.

After the annealing, the GaAs layer 2 is etched to remove a surface portion of, e.g., from 10 to 20 nm, by a wet etching method using sulfuric acid ($H_2SO_4$) or potassium hydroxide (KOH) or by a plasma etching method using an etchant gas such as $CCl_4$, $CCl_2F_2$. The semiconductor device is then placed in an MBE apparatus, where the GaAs layer 2 is further cleaned under a high vacuum condition by etching of hydrogen chloride (HCl) gas or by sputtering of argon (Ar) or helium (He) gas so as to completely remove an undesirable oxide film.

Figure 1D:
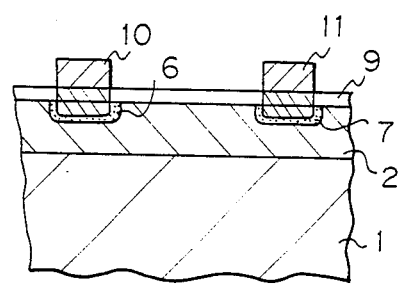

Next, as illustrated in FIG. 1d, an n-type AlGaAs layer 9 (i.e., a second semiconductor layer serving as an electron-supply layer) is epitaxially grown on the undoped GaAs layer 2 by an MBE method, so that the AlGaAs layer 9 and the GaAs layer 2 form a heterojunction. The AlGaAs layer 9 has a thickness of from 40 to 100 nm, e.g., approximately 80 nm, and is doped with Si impurities of a dose of, e.g., 1 to $2 \times 10^{18}$ cm$^{-3}$.

As illustrated in FIG. 1d, a gold-germanium (AuGe) film and a Au film are continuously formed on the AlGaAs layer 9 by a conventional vacuum evaporation method and are patterned by a suitable method to form a source electrode 10 and a drain electrode 11 above the impurity doped regions 6 and 7, respectively. In order to alloy portions of the AlGaAs layer 9 and the doped regions 6 and 7 with the electrodes 10 and 11, heat-treatment is carried out at approximately 450° C. for approximately 1 minute. Therefore, alloyed regions 12 and 13 are formed to attain ohmic contact between the alloyed regions and the 2DEG layer.

Figure 1E:
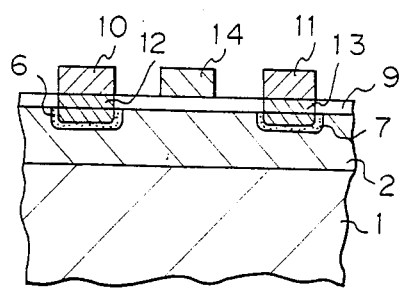

Next, as illustrated in FIG. 1e, a gate electrode 14 forming a Schottky barrier with the n-type AlGaAs layer 9 is formed on the AlGaAs layer 9 by vacuum evaporation of a triple layer of titanium (Ti)/platinum (Pt)/Au or an aluminum (Al) layer and patterning treatment.

The resultant FET utilizing the 2DEG has a source or drain contact resistance of from $10^{-6}$ to $10^{-7}$ $\Omega$cm, which is smaller than the approximately $10^{-5}$ $\Omega$cm of a similar FET of the prior art. Accordingly, it is possible to produce a FET having lower noise and higher operating speed as compared with prior art FET's.

In the above-mentioned embodiment of the present invention, the GaAs layer 2 is used as the first semiconductor layer and the AlGaAs layer 9 is used as the second semiconductor layer. However, if the electron affinity of the second semiconductor layer is larger than that of the first semiconductor layer and the lattice constant of the second semiconductor layer is equal or similar to that of the first semiconductor layer, GaAs, germanium (Ge), indium-antimonide (InSb), or indium-arsenide (InAs) may be used for the first semiconductor layer and AlGaAs, GaAs, cadmium-telluride (CdTe), or gallium-antimonide (GaSb) may be used for the second semiconductor layer. It is possible to use combinations of Ge (first layer) and AlGaAs (second layer), Ge and GaAs, InSb and CdTe, and InAs and GaSb in addition to the above-mentioned combination of GaAs and AlGaAs.

According to another embodiment of hhe present invention, it is possible to form a conductive line or a resistor connected with the FET of the present invention by ion-implantation of impurities into the first semiconductor layer. This ion-implantation is carried out simultaneously with or independently from the above-mentioned ion-implantation for the formation of the impurity doped regions.

Figure 2A:
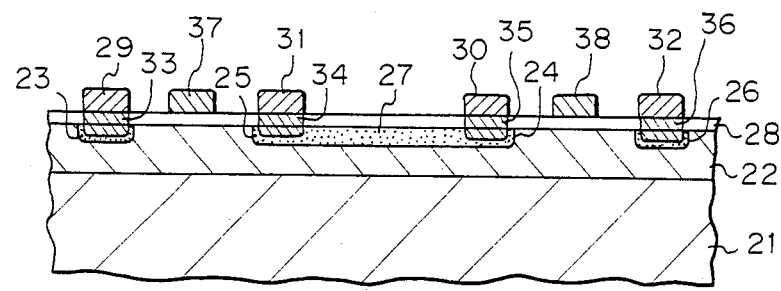
FIG. 2a is a schematic sectional view of a semiconductor device including two FET's utilizing the 2DEG and a conductive line.
Figure 2B:
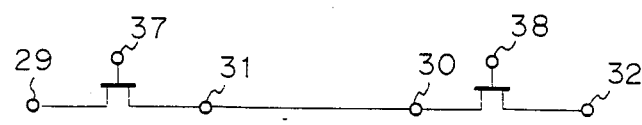

As illustrated in FIGS. 2a and 2b, a semiconductor device comprising two FET's having the heterojunction and utilizing the 2DEG and a conductive line connecting the two FET's is produced in the following manner.

An undoped GaAs layer 22 is formed on a semi-insulating GaAs substrate 21 by an MBE method as explained in the above-described embodiment. Si impurities are selectively doped into the GaAs layer 22 to form impurity doped regions 23, 24, 25, and 26 for the two FET's and simultaneously form a Si doped region 27 between the regions 25 and 24 as the conductive line. In this case, a masking film (not shown) used in the ion-implantation has three windows: for the regions 23, 26 and the combined region of 25, 27, and 24. Then, after the annealing step and the cleaning of the surface of the GaAs layer 22, an n-type AlGaAs layer 28 doped with Si is formed on the GaAs layer 22 by an MBE method. Source electrodes 29 and 30 and drain electrodes 31 and 32 of AuGe/Au are formed on the AlGaAs layer. Heat-treatment for alloying is carried out to form alloyed regions 33, 34, 35, and 36 extending into the impurity doped regions 23, 24, 25, and 26, respectively. Then, gate electrodes 37 and 38 of Ti/Pt/Au or Al are formed on the AlGaAs layer.

The obtained semiconductor device has the Si doped region 27 serving as an internal conductive line which connects the drain electrode 31 of one of the FET's and the source electrode 30 of the another FET.

Figure 3A:
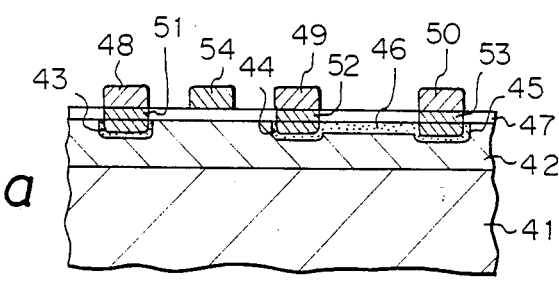
FIG. 3a is a schematic sectional view of a semiconductor device including a FET utilizing the 2DEG and a resistor.
Figure 3B:
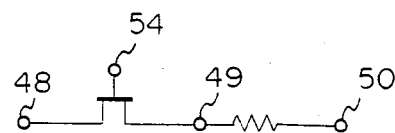

As illustrated in FIGS. 3a and 3b, a semiconductor device including the FET of the present invention and a resistor is produced in the following manner.

Figure 4A:
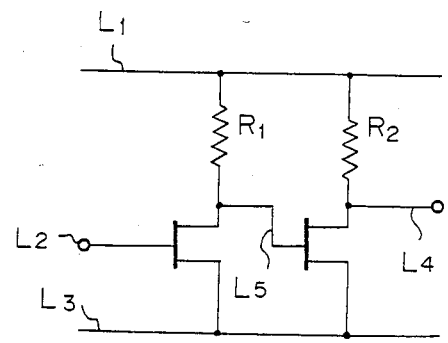
FIG. 4a is a circuit including two FET's and two resistors.
Figure 4B:
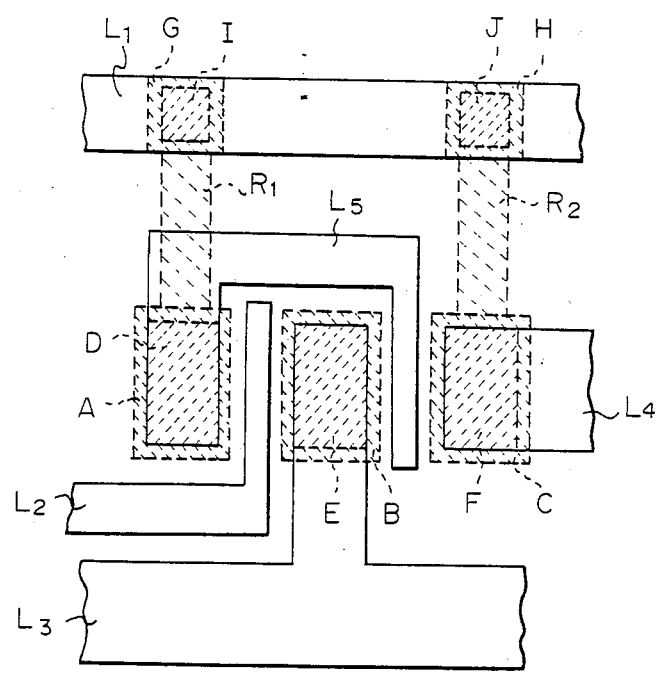

An undoped GaAs layer 42 is formed on a semi-insulating GaAs substrate 41 by an MBE method, as explained in the above-described embodiment. Si impurities are selectively doped into the GaAs layer 42 to form impurity doped regions 43, 44, and 45 by an ion-implantation method using a masking film in which three windows are opened. After removing the masking film, another masking film (not shown) is formed on the GaAs layer 42 and is selectively etched to open a window for the resistor. Then, Si impurities are doped into the GaAs layer 42 through the window to form an Si doped region 46 between the impurity doped regions 44 and 45 by an ion-implantation method under suitable conditions for attaining a desired resistance of the resistor. After removing the other masking film, an annealing step and cleaning step are performed as mentioned in the above embodiment. Then, an n-type AlGaAs layer 47 doped with Si is formed on the GaAs layer 42 by an MBE method. A source electrode 48, a drain electrode 49, and a contact electrode 50 of AuGe/Au are formed on the AlGaAs layer. Heat-treatment for alloying is carried out to form alloyed regions 51, 52, and 53 extending into the doped region 43, 44, and 45, respectively. Then, a gate electrode 54 of Ti/Pt/Au or Al is formed on the AlGaAs layer. The obtained semiconductor device has the Si doped region 46 serving as an internal resistor. For example, in the case where a circuit of FIG. 4a comprises two of the circuits of FIG. 3b, a semiconductor device as illustrated in FIG. 4b is obtained. In this case, impurity doped regions A, B, and C are connected to metal lines $L_5$, $L_3$, and $L_4$ through alloyed regions D, E, and F, respectively. Impurity doped regions G and H are connected to a metal line $L_1$ through alloyed regions I and J, respectively. A resistor $R_1$ of a Si doped region is formed between the impurity doped regions A and G and another resistor $R_2$ of a Si doped region is formed between the regions C and H. A gate electrode $L_2$ of metal is located between the impurity doped regions A and B.

Although the surface of the GaAs layer is cleaned by etching in a conventional etching apparatus and further etching in an MBE apparatus, the interface (i.e., the heterojunction) quality of the GaAs layer and the AlGaAs layer grown at different stages by an MBE method in the cases of the above-mentioned embodiments is inferior to that of the GaAs layer and the AlGaAs layer which are consecutively grown by an MBE method. Accordingly, electron mobility of the 2DEG in the cases of the above-mentioned embodiments is inferior to that in the case of consecutive epitaxial growth. In order to prevent such deterioration, it is preferable to form a thin semiconductor layer of the same material as the GaAs layer (the first semiconductor layer) between the GaAs layer and the AlGaAs layer (the second semiconductor layer) before the formation of the AlGaAs layer and to epitaxially grow the thin layer and the second layer continuously without break of the vacuum. A semiconductor device of an FET utilizing the 2DEG and having low source and drain contact resistances and good electron mobility of the 2DEG is thusly produced in the following manner.

As explained in the above-mentioned embodiment with reference to FIGS. 1a to 1c, the undoped GaAs layer 2 is formed on the semi-insulating GaAs substrate 1, the impurity doped regions 6 and 7 are formed in the GaAs layer 2, and annealing is carried out. Then, the protective film 8 is removed and the surface of the GaAs layer 2 is cleaned by etching in a conventional etching apparatus and further etching in an MBE apparatus.

Figure 5A:
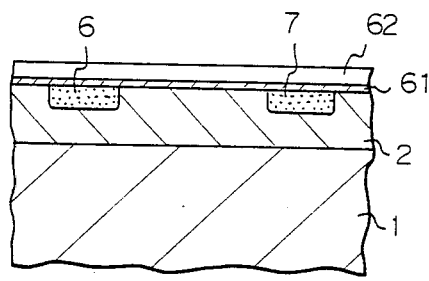
FIGS. 5a and 5b are schematic sectional views of a semiconductor device including a FET utilizing the 2DEG in various stages of production in accordance with another embodiment of the present invention.

Next, as illustrated in FIG. 5a, a thin undoped GaAS layer 61 having a thickness of 5 to 20 nm is grown on the cleaned GaAs layer 2 by an MBE method using the same apparatus. Without breaking the high vacuum in the MBE apparatus, an n-type AlGaAs layer 62 is consecutively grown on the thin layer 61 by an MBE method. The AlGaAs layer 62 of the second semiconductor layer is doped with Si of a dose of, e.g., from 1 to $2 \times 10^{18}$ cm$^{-3}$, and has a thickness of e.g., 80 nm.

Figure 5B:
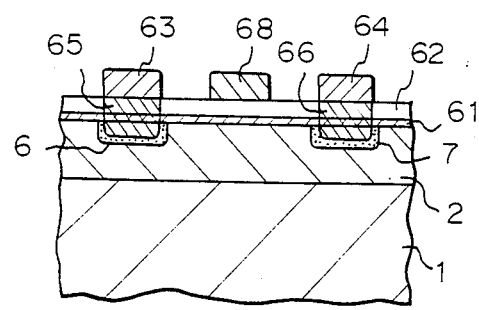

As illustrated in FIG. 5b, a source electrode 63 and a drain electrode 64 of AuGe/Au are formed on the AlGaAs layer 62 above the impurity doped regions 6 and 7, respectively. Heat-treatment (approximately 450° C. for 1 minute) is carried out so as to alloy portions of the AlGaAs layer 62, and thin GaAs layer 61, and the GaAs layer 2 with the metal of the electrodes 63 and 64. Thus, the obtained alloyed regions 65 and 66 extend into the impurity doped region 6 and 7, respectively. Then, a gate electrode 68 of Ti/Pt/Au or Al is formed on the AlGaAs layer 62.

The obtained FET has a good heterojunction between the thin GaAs layer 61 and the n-type AlGaAs layer 62 and the 2DEG generates in the thin GaAs layer 61, so that the electron mobility of the 2DEG is not deteriorated. Since the thin GaAs layer 61 is very thin, the thin layer 61 does not substantially increase the series resistance. Therefore, the source and drain contact resistance can be sufficiently reduced.

It is possible to combine a conductive line or a resistor formed in the GaAs layer 2 with the obtained FET in a similar manner to that illustrated in FIGS. 2a and 3a.

It will be obvious that the present invention is not restricted to the above-mentioned embodiments and that many variations are possible for those skilled in the art without departing from the scope of the present invention. For example, an n-type GaAs layer can be formed on the AlGaAs layer of the second semiconductor layer except for the portion on which a gate electrode is formed. Therefore a source electrode and a drain electrode should be formed on the n-type GaAs layer.

I claim:

1. A method of producing a semiconductor device having a heterojunction and utilizing a two-dimensional electron gas, comprising, in sequence, the steps of:
    forming a first semiconductor layer on a substrate;
    forming impurity doped regions by doping impurities into the first semiconductor layer;
    forming a second semiconductor layer over the first semiconductor layer including the impurity doped regions, the second semiconductor layer being an electron-supply layer having a smaller electron affinity than that of the first semiconductor layer;
    forming a source electrode and a drain electrode on the second semiconductor layer above respective ones of the impurity doped regions; and
    forming a gate electrode on the second semiconductor layer.

2. A method according to claim 1, wherein said step of forming the impurity doped regions comprises the substeps of:
    forming a masking film on the first semiconductor layer;
    selectively etching the masking film to open windows;

doping the impurities into the first semiconductor layer through the windows by an ion-implantation method;

removing the masking film; and annealing the first semiconductor layer having the impurity doped regions.

3. A method according to claim 2, wherein said step of forming the impurity doped regions further includes a substep of forming a further impurity doped region for serving as a predetermined one of a conductive line and a resistor by doping impurities into the first semiconductor layer.

4. A method according to claim 3, wherein said substep of selectively etching the masking film inlcudes selectively etching the masking film to open a further window for the further impurity doped region.

5. A method according to claim 3, wherein said substep of forming the further impurity doped region comprises, between said removing substep and said annealing substep, the substeps of:

forming a further masking film on the first semiconductor layer;

selectively etching the further masking film to open a window;

doping the impurities into the first semiconductor layer through the window by an ion-implantation method; and removing the further masking film.

6. A method according to claim 2, wherein said annealing step is carried out by using a heating furnance.

7. A method according to claim 2, wherein said annealing step is carried out by a lamp annealing method.

8. A method according to claim 2, wherein before said annealing step, a protective film is formed on the first semiconductor layer and then is removed after said annealing step.

9. A method according to claim 2, wherein, during said annealing step, the exposed surface of the first semiconductor layer is exposed to a mixture gas of hydrogen ($H_2$), nitrogen ($N_2$), and arsine ($AsH_3$).

10. A method according to claim 1, wherein the steps of forming the first and second semiconductor layers include forming the first semiconcductor layer and second semiconductor layer using a molecular beam epitaxy method.

11. A method according to claim 10, further comprising the step of cleaning the surface of the first semiconductor layer before the formation of the second semiconductor layer.

12. A method according to claim 1, wherein, after said step of forming the source and drain electrodes, said method comprises the step of alloying respective portions of the second and first semiconductor layers with the source and drain electrodes to form alloyed regions extending into the respective impurity doped regions, respectively.

13. A method according to claim 1, wherein the first semiconductor layer is of a material selected from the group consisting of gallium-arsenide, germanium, indium-antimonide, and indium-arsenide.

14. A method according to claim 1, wherein the second semiconductor layer is of a material selected from the group consisting of aluminum-gallium-arsenide, gallium-arsenide, cadmium-telluride, and gallium-antimonide.

15. A method according to claim 1, wherein the substrate is of a semi-insulating gallium-arsenide, the first semiconductor layer is of an updoped gallium-arsenide, and the second semiconductor layer is of an n-type aluminum-gallium-arsenide.

16. A method of producing a semiconductor device having a heterojunction and utilizing a two-dimensional electron gas, comprising, in sequence, the steps of:

forming a first semiconductor layer on a substrate;

forming impurity doped regions by doping impurities into the first semiconductor layer;

forming a thin semiconductor layer of the same material as the first semiconductor layer over the first semiconductor layer including the impurity doped regions;

forming a second semiconductor layer, as an electron-supply layer having a smaller electron affinity than that of the first semiconductor layer, on the thin semiconductor layer;

forming a source electrode and a drain electrode on the second semiconductor layer above respective ones of the impurity doped regions; and forming a gate electrode on the second semiconductor layer.

17. A method according to claim 16, wherein said step of forming the impurity doped regions comprises the substeps of:

forming a masking film on the first semiconductor layer;

selectively etching the masking film to open windows;

doping the impurities into the first semiconductor layer through the windows by an ion-implantation method;

removing the masking film; and annealing the first semiconductor layer having the impurity doped regions.

18. A method according to claim 17, wherein said step of forming the impurity doped regions includes a step of forming a further impurity doped region serving as a predetermined one of a conductive line and a resistor, by doping impurities into the first semiconductor layer.

19. A method according to claim 18, wherien said step of selectively etching the masking film includes selectively etching the masking film to open a further window for the further impurity doped region of the conductive line.

20. A method according to claim 18, wherein said step of forming the further impurity doped region comprises, between said removing substep and said annealing substep, the substeps of:

forming a further masking film on the first semiconductor layer;

selectively etching the further masking film to open a window;

doping the impurities into the first semiconductor layer through the window by an ion-implantation method; and removing the further masking film.

21. A method according to claim 16, wherein said annealing step is carried out by using a heating furnace.

22. A method according to claim 17, wherein said annealing step is carried out by a lamp annealing method.

23. A method according to claim 17, wherein said steps of forming the thin semiconductor layer and the second semiconductor layer include consecutively growing the thin semiconductor layer and the second semiconductor layer using the molecular beam epitaxy method.

24. A method according to claim 16, wherein, before said annealing step, a protective film is formed on the first semiconductor layer and then is removed after said annealing step.

25. A method according to claim 16, wherein, during said annealing step, the exposed surface of the first semiconductor layer is exposed to a mixture gas of hydrogen ($H_2$), nitrogen ($N_2$), and arsine ($AsH_3$).

26. A method according to claim 16, wherein said steps of forming the first and second semiconductor layers and the thin semiconductor layer include forming the first semiconductor layer, the second semiconductor layer and the thin semiconductor layer using a molecular beam epitaxy method.

27. A method according to claim 16, wherein after said step of forming the source and drain electrodes, said method comprises the step of alloying portions of the second, thin and first semiconductor layers with the source and drain electrodes to form alloyed regions extending into the impurity doped regions.

28. A method according to claim 16, wherein the first semiconductor layer is of a material selected from the group consisting of gallium-arsenide, germanium, indium-antimonide, and insium-arsenide.

29. a method according to claim 16, wherein the second semiconductor layer is of a material selected from the group consisting of aluminum-gallium-arsenide, gallium-arsenide, cadmium-telluride, and gallium-antimonide.

30. A method according to claim 16, wherein the substrate is of semi-insulating gallium-arsenide, the first semiconductor layer and the thin semiconductor layer are of an undoped gallium-arsenide, and the second semiconductor layer is of an n-type aluminum-gallium-arsenide.

* * * * *

UNITED STATES PATENT AND TRADEMARK OFFICE
CERTIFICATE OF CORRECTION

PATENT NO. : 4,795,717
DATED      : JANUARY 3, 1989
INVENTOR(S) : SHIGERU OKAMURA

It is certified that error appears in the above-identified patent and that said Letters Patent is hereby corrected as shown below:

```
Col. 4, line 26, "hhe" should be --the--.

Col. 5, line 61, "GaAS" should be --GaAs--.

Col. 6, line 1, "GaAS" should be --GaAs--.

Col. 7, line 30, "furnance" should be --furnace--;
        line 33, after "wherein" insert --,--.

Col. 8, line 57, start a new paragraph, with paragraph
        indentation, beginning with the word "removing".

Col. 10, line 6, "insium" should be --indium--;
         line 7, "a" should be --A--.
```

Signed and Sealed this

Second Day of May, 1989

Attest:

DONALD J. QUIGG

Attesting Officer

Commissioner of Patents and Trademarks